United States Patent
Chen et al.

(10) Patent No.: US 11,363,734 B2
(45) Date of Patent: Jun. 14, 2022

(54) ANTENNA ALIGNMENT-MONITORING METHOD AND ANTENNA ALIGNMENT-MONITORING SYSTEM

(71) Applicants: LITE-ON ELECTRONICS (GUANGZHOU) LIMITED, Guangzhou (CN); LITE-ON TECHNOLOGY CORPORATION, Taipei (TW)

(72) Inventors: Jian-Lun Chen, Taipei (TW); Kuan-Chuan Chou, Taipei (TW); Wei-Xiang Chen, Taipei (TW); Hai-Tao Yu, Taipei (TW)

(73) Assignees: LITE-ON ELECTRONICS (GUANGZHOU) LIMITED; LITE-ON TECHNOLOGY CORPORATION

( * ) Notice: Subject to any disclaimer, the term of this patent is extended or adjusted under 35 U.S.C. 154(b) by 12 days.

(21) Appl. No.: 17/092,006

(22) Filed: Nov. 6, 2020

(65) Prior Publication Data
US 2021/0210848 A1   Jul. 8, 2021

Related U.S. Application Data

(60) Provisional application No. 62/956,360, filed on Jan. 2, 2020.

(51) Int. Cl.
*H04B 17/11* (2015.01)
*H05K 5/06* (2006.01)
(Continued)

(52) U.S. Cl.
CPC ............ *H05K 5/069* (2013.01); *F16M 13/00* (2013.01); *G01R 29/105* (2013.01);
(Continued)

(58) Field of Classification Search
CPC ...... H05K 5/069; G01R 29/105; G01R 29/10; H01Q 1/1207; H01Q 3/005; H01Q 3/08;
(Continued)

(56) References Cited

U.S. PATENT DOCUMENTS

2006/0145884 A1* 7/2006 Graham ................ H01Q 3/267
340/687
2009/0033576 A1* 2/2009 Smoyer .................... H01Q 3/02
343/761
(Continued)

*Primary Examiner* — Don N Vo
(74) *Attorney, Agent, or Firm* — Innovation Counsel LLP

(57) ABSTRACT

An antenna alignment-monitoring method and an antenna alignment-monitoring system are provided. The antenna alignment-monitoring method includes the following steps. An alignment-monitoring system measures an antenna to obtain azimuth information, tilt information and roll information of the antenna. The azimuth information, the tilt information and the roll information are sent from the alignment-monitoring system to a portable device or a server. The azimuth information, the tilt information and the roll information are sent to the portable device and shown on a user interface for aligning the antenna. The azimuth information, the tilt information and the roll information are sent to the server for monitoring the antenna.

20 Claims, 6 Drawing Sheets

(51) Int. Cl.
  *G01R 29/10*   (2006.01)
  *H04B 17/27*   (2015.01)
  *H01Q 3/00*    (2006.01)
  *H01Q 1/12*    (2006.01)
  *H04B 17/16*   (2015.01)
  *F16M 13/00*   (2006.01)
  *H05K 5/02*    (2006.01)

(52) U.S. Cl.
  CPC ........... *H01Q 1/1207* (2013.01); *H01Q 3/005* (2013.01); *H04B 17/11* (2015.01); *H04B 17/16* (2015.01); *H04B 17/27* (2015.01); *H05K 5/0204* (2013.01)

(58) Field of Classification Search
  CPC .......... H01Q 1/02; H04B 17/11; H04B 17/23; H04B 17/27
  USPC .............................. 375/224, 228; 340/870.04
  See application file for complete search history.

(56) References Cited

U.S. PATENT DOCUMENTS

| | | | |
|---|---|---|---|
| 2009/0061941 A1* | 3/2009 | Clark | H01Q 3/005 455/562.1 |
| 2010/0188304 A1* | 7/2010 | Clymer | H01Q 13/0258 343/753 |
| 2016/0020504 A1* | 1/2016 | Michaelis | H01Q 1/125 342/359 |
| 2019/0013566 A1* | 1/2019 | Merrell | H01Q 3/08 |

* cited by examiner

ANTENNA ALIGNMENT-MONITORING METHOD AND ANTENNA ALIGNMENT-MONITORING SYSTEM

This application claims the benefit of U.S. provisional application Ser. No. 62/956,360, filed Jan. 2, 2020, the disclosure of which is incorporated by reference herein in its entirety.

TECHNICAL FIELD

The disclosure relates in general to an alignment-monitoring method and an alignment-monitoring system, and more particularly to an antenna alignment-monitoring method and an antenna alignment-monitoring system.

BACKGROUND

Along with the development of the wireless communication, various communication products are invented. In order to deploy a wireless network, many antennas must be erected. When setting up an antenna, the angle and the orientation must be adjusted accurately to obtain the best transmission performance. In addition, the antenna is easily affected by weather or earthquakes, which can cause tilt. Therefore, the angle and the orientation of the antenna must be constantly monitored to maintain the best transmission performance.

SUMMARY

The disclosure is directed to an antenna alignment-monitoring method and an antenna alignment-monitoring system. Angle and orientation of an antenna are measured and sent to a portable device or a server for aligning and monitoring the antenna, such that the angle and the orientation can be adjusted accurately to obtain the best transmission performance when setting up the antenna and the angle and the orientation of the antenna can be constantly monitored to maintain the best transmission performance.

According to one embodiment, an antenna alignment-monitoring method is provided. The antenna alignment-monitoring method includes the following steps. An alignment-monitoring system measures an antenna to obtain azimuth information, tilt information and roll information of the antenna. The azimuth information, the tilt information and the roll information are sent from the alignment-monitoring system to a portable device or a server. The azimuth information, the tilt information and the roll information are sent to the portable device and shown on a user interface for aligning the antenna. The azimuth information, the tilt information and the roll information are sent to the server for monitoring the antenna.

According to another embodiment, an antenna alignment-monitoring method is provided. The antenna alignment-monitoring method includes the following steps. An alignment device measures an antenna to obtain azimuth information, tilt information and roll information of the antenna. The azimuth information, the tilt information and the roll information are sent from the alignment device to a portable device. The azimuth information, the tilt information and the roll information are shown on a user interface of the portable device for aligning the antenna. A monitoring device measures the antenna to obtain the azimuth information, the tilt information and the roll information of the antenna. The azimuth information, the tilt information and the roll information are sent from the monitoring device to a server for monitoring the antenna.

According to an alternative embodiment, an antenna alignment-monitoring system is provided. The antenna alignment-monitoring system includes a measuring circuit and a communication circuit. The measuring circuit is configured to measure an antenna to obtain azimuth information, tilt information and roll information of the antenna. The communication circuit is configured to send the azimuth information, the tilt information and the roll information to a portable device or a server. The azimuth information, the tilt information and the roll information are sent to the portable device and shown on a user interface of the portable device for aligning the antenna. The azimuth information, the tilt information and the roll information are sent to the server for monitoring the antenna.

Figure 1:
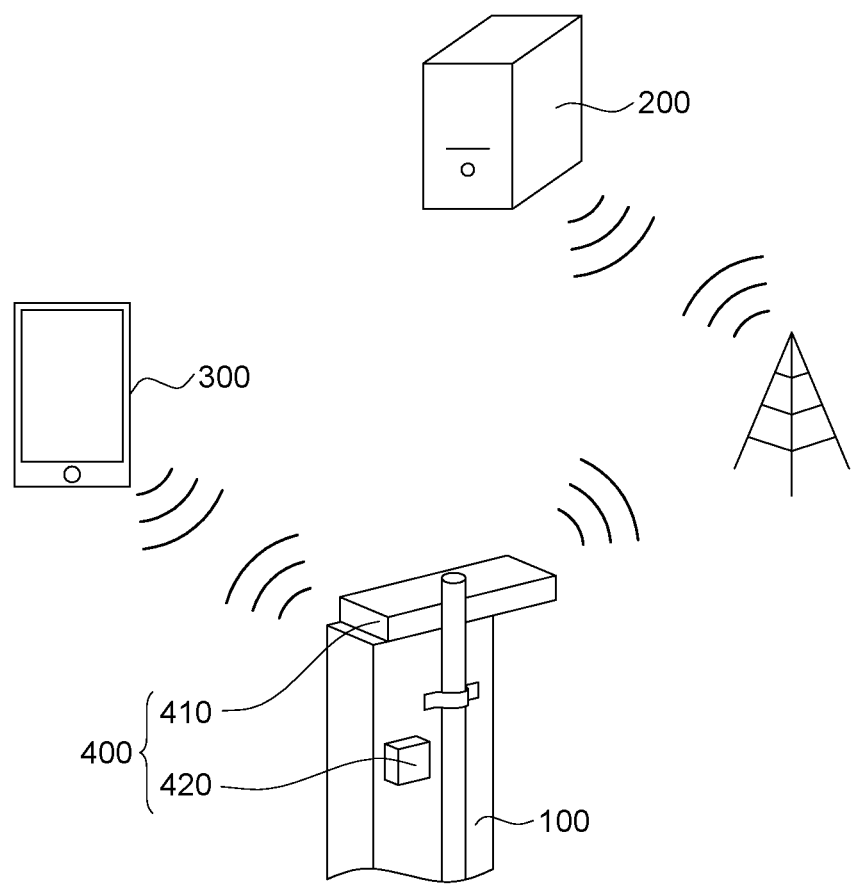
FIG. 1 shows an antenna, a server, a portable device and an antenna alignment-monitoring system.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring please to FIG. 1, an antenna 100, a server 200, a portable device 300 and an antenna alignment-monitoring system 400 are shown. The antenna 100 may be a Dipole Antenna, a Vertical Antenna, a Window Antenna, or a Yagi Antenna. The server 200 is used for recording data and analyzing the data. The server 200 is, for example, a data center, a computer or a computing cloud. The portable device 300 is used for showing data. The portable device 300 is, for example, a smart phone, a tablet computer, a laptop computer, a display panel or a speaker. The antenna alignment-monitoring system 400 is used for aligning the antenna 100 and then monitoring the antenna 100. For example, the antenna alignment-monitoring system 400 may be a single component for aligning and monitoring the antenna 100. Or, the antenna alignment-monitoring system 400 may be composed of two separate components, wherein one is for aligning the antenna 100 and another one is for monitoring the antenna 100. As shown in FIG. 1, the antenna alignment-monitoring system 400 includes an alignment device 410 and a monitoring device 420. When the antenna 100 is initially set up, the antenna 100 is aligned through the alignment device 410, such that each of azimuth information, tilt information, roll information and altitude information of the antenna 100 can be set up at a planned value. During the operation of the antenna 100, the antenna 100 is monitored through the monitoring device 420, such that whether the azimuth information, the tilt information and the roll information of the antenna 100 are changed can be monitored.

Figure 2:
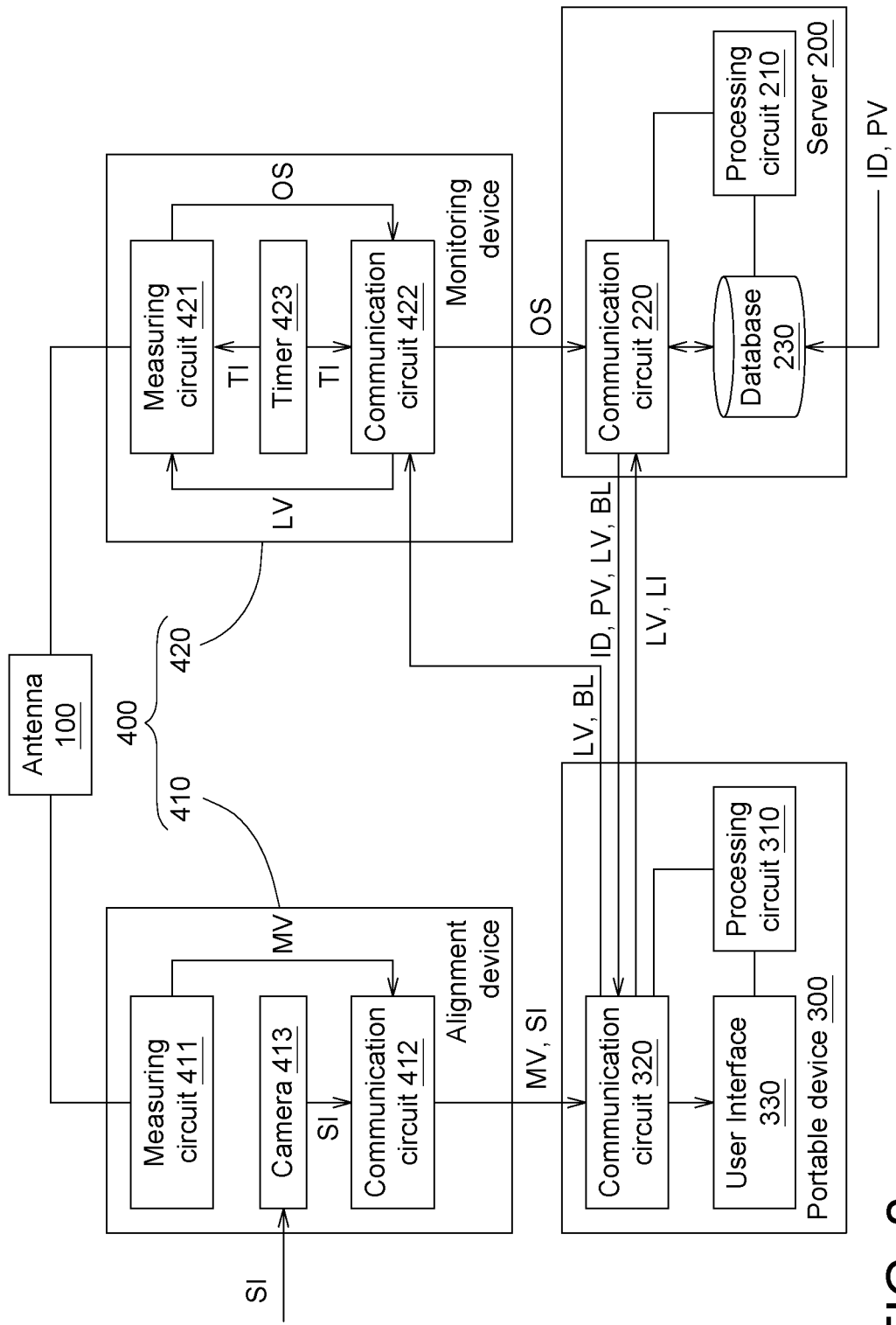
FIG. 2 shows a block diagram of the antenna, the server, the portable device and the antenna alignment-monitoring system.

Refer please to FIG. 2, which shows a block diagram of the antenna 100, the server 200, the portable device 300 and the antenna alignment-monitoring system 400. The server 200 includes a processing circuit 210, a communication circuit 220 and a database 230. The processing circuit 210 is configured to perform the analyzing procedure, the calculating procedure or the controlling procedure. The processing circuit 210 is, for example, a chip or a circuit board. The communication circuit 220 is configured to perform the communication procedure. The communication circuit 220 is, for example, a long Term Evolution (LTE) communication circuit, a Wi-Fi communication circuit, a cable network circuit or a combination thereof. The database 230 is configured to store data. The database 230 is, for example, a hard disk, a memory or a storing cloud.

The portable device 300 includes a processing circuit 310, a communication circuit 320 and a user interface 330. The processing circuit 310 is configured to perform the analyzing procedure, the calculating procedure or the controlling procedure. The processing circuit 310 is, for example, a chip or a circuit board. The communication circuit 320 is configured to perform the communication procedure. The communication circuit 320 is, for example, a long Term Evolution (LTE) communication circuit, a Wi-Fi communication circuit, a Bluetooth communication circuit or a combination thereof. The user interface 330 is configured to show data. The user interface 330 is, for example, performed through a display, an audio player or a printer.

The alignment device 410 includes a measuring circuit 411, a communication circuit 412 and a camera 413. The measuring circuit 411 is configured to measure at least the azimuth information, the tilt information and the roll information of the antenna 100. The measuring circuit 411 is, for example, a Gyro, compass, an Infrared distance measurer or a combination thereof. The communication circuit 412 is configured to perform the communication procedure. The communication circuit 412 is, for example, a Wi-Fi communication circuit, a Bluetooth communication circuit or a combination thereof. The camera 413 is configured to capture a real-time surrounding image SI of the antenna 100.

The monitoring device 420 includes a measuring circuit 421, a communication circuit 422 and a timer 423. The measuring circuit 421 is configured to measure at least the azimuth information, the tilt information and the roll information of the antenna 100. The measuring circuit 421 is, for example, a Gyro, compass, an Infrared distance measurer or a combination thereof. The communication circuit 422 is configured to perform the communication procedure. The communication circuit 422 is, for example, a Wi-Fi communication circuit, a Bluetooth communication circuit, a LTE communication circuit or a combination thereof. The timer 423 is configured to obtain a time information, such as a standard time obtained from the network or a cumulative time. The timer 423 is, for example, a timing chip, a quartz clock or a digital clock. The operation of those elements is illustrated via a flowchart.

Figure 3:
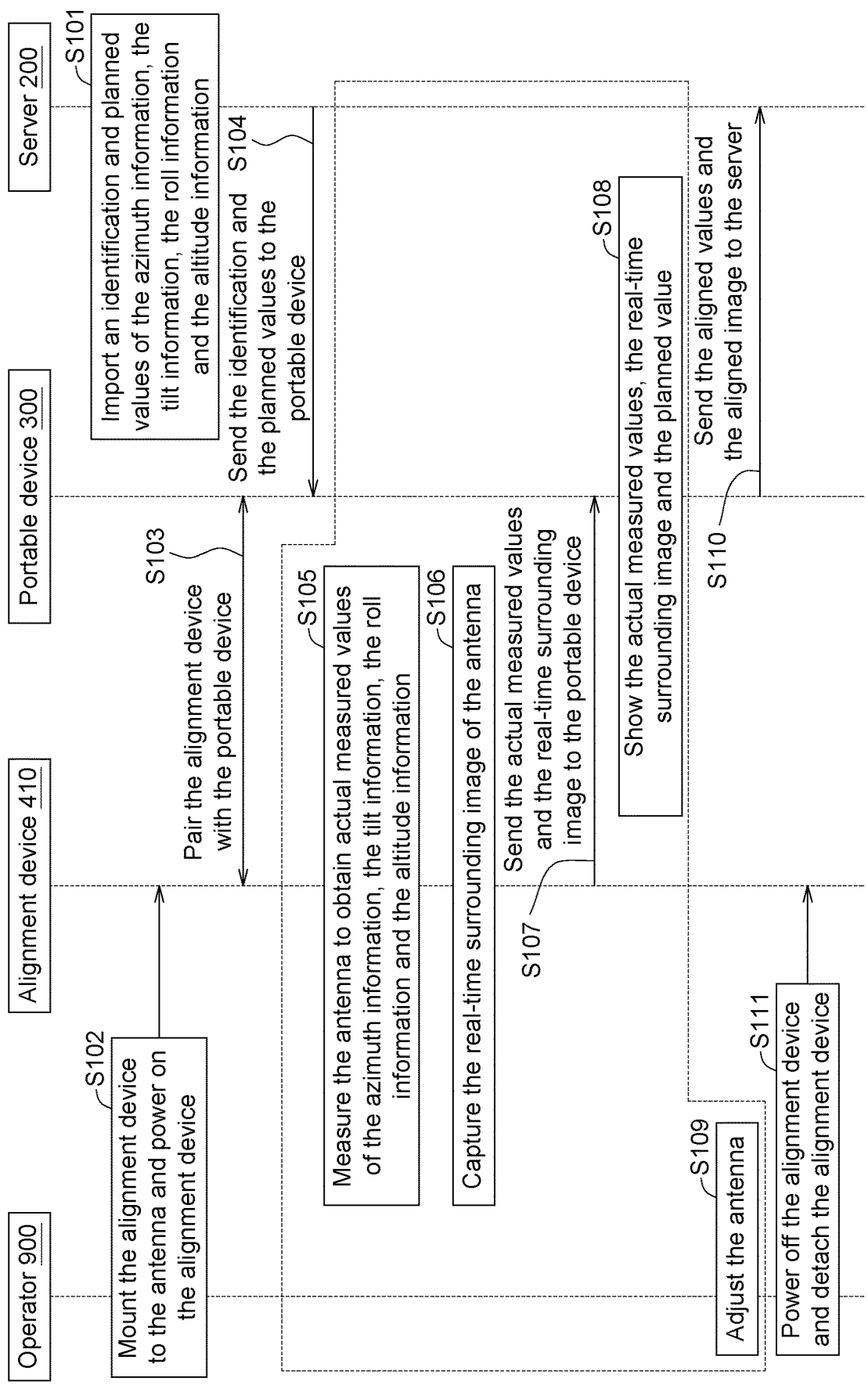
FIG. 3 shows a flowchart of an alignment procedure of an antenna alignment-monitoring method according to one embodiment.

Refer please to FIG. 2 and FIG. 3. FIG. 3 shows a flowchart of an alignment procedure of an antenna alignment-monitoring method according to one embodiment. At the step S101, an identification ID and planned values PV of the azimuth information, the tilt information, the roll information and the altitude information of the antenna 100 are imported to the server 200.

Then, at step S102, an operator 900 mounts the alignment device 410 to the antenna 100 and powers on the alignment device 410 of the antenna alignment-monitoring system 400. The alignment device 410 is detachably engaged with the antenna 100. For example, the alignment device 410 may be engaged with the antenna 100 through plugs, slides or screws. The alignment device 410 can be detached from the antenna 100 after finishing the alignment.

Next, at the step S103, the alignment device 410 is paired with the portable device 300. For example, the alignment device 410 and the portable device 300 can be paired via a Bluetooth communication.

Afterwards, at the step S104, the communication circuit 220 of the server 200 sends the identification ID and the planned values PV of the azimuth information, the tilt information, the roll information and the altitude information of the antenna 100 to the portable device 300. In this step, the identification ID and the planned values PV are sent from the server 200 to the portable device 300 via the LTE communication or the Wi-Fi communication.

Then, at the step S105, the measuring circuit 411 of the alignment device 410 measures the antenna 100 to obtain actual measured values MV of the azimuth information, the tilt information, the roll information and the altitude information of the antenna 100.

At the step S106, the camera 413 of the alignment device 410 captures the real-time surrounding image SI of the antenna 100. The step S105 and the S106 can be performed at the same time.

Then, at step S107, the communication circuit 412 of the alignment device 410 sends the actual measured values MV and the real-time surrounding image SI to the portable device 300. In this step, the actual measured values MV and the real-time surrounding image SI are sent from the alignment device 410 to the portable device 300 via the Bluetooth communication.

Afterwards, at step S108, the user interface 330 of the portable device 300 shows the actual measured values MV, the real-time surrounding image SI and the planned value PV.

Then, at step S109, the operator 900 adjusts the antenna 100 according to the actual measured values MV, the real-time surrounding image SI and the planned value PV. The step S105 to S109 are repeatedly performed until the actual measured values MV and the planned value PV are matched.

In one embodiment, the antenna 100 may be mounted on a pole with height scale, so the altitude information of the antenna 100 is no need to be measured. The measuring circuit 411 may only measure the actual measured values MV of the azimuth information, the tilt information and the roll information.

In other embodiment, the capturing and the communication of the real-time surrounding image SI can be omitted for saving the transmission loading.

Next, at the step S110, the communication circuit 320 of the portable device 300 sends the aligned values LV and the aligned image LI to the server 200. In this step, the aligned values LV and the aligned image LI are sent from the portable device 300 to the server 200 via the Wi-Fi communication or the LTE communication. The aligned values LV and the aligned image LI are stored in the database 230.

Afterwards, at the step S111, the operator 900 powers off the alignment device 410 and detaches the alignment device 410 from the antenna 100.

Based on above, the antenna 100 is aligned according to the planned values PV of the azimuth information, the tilt information, the roll information and the altitude information.

Figure 4:
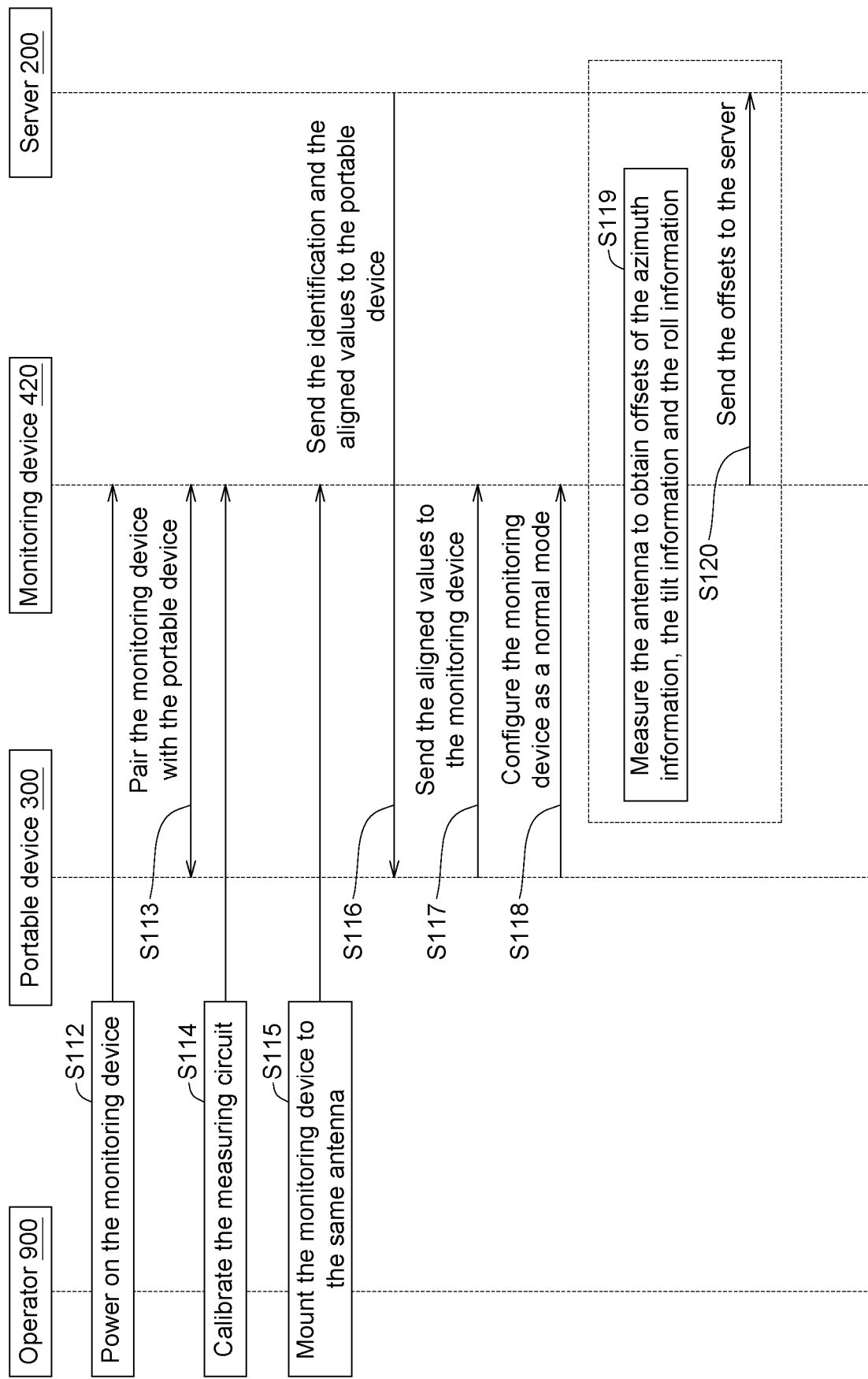
FIG. 4 shows a flowchart of a monitoring procedure of the antenna alignment-monitoring method according to one embodiment.

Because the antenna 100 is easily affected by weather or earthquakes, which can cause tilt. Therefore, the antenna 100 must be constantly monitored to maintain the best transmission performance. Refer please to FIG. 2 and FIG. 4. FIG. 4 shows a flowchart of a monitoring procedure of the antenna alignment-monitoring method according to one embodiment. At step S112, the operator 900 powers on the monitoring device 420 of the antenna alignment-monitoring system 400. The operator 900 may push the STATUS button to activate the monitoring device 420.

At step S113, the monitoring device 420 is paired with the portable device 300. In this step, the monitoring device 420 and the portable device 300 are paired via the Bluetooth communication.

Then, at step S114, the operator 900 calibrates the measuring circuit 421. For example, the operator 900 may swing the monitoring device 420 in an 8 shaped trace to calibrate the measuring circuit 421.

Next, at step S115, the operator 900 mounts the monitoring device 420 to the same antenna 100. In this step, the monitoring device 420 is fixedly adhered to the antenna 100.

Then, at step S116, the communication circuit 220 of the server 200 sends the identification ID and the aligned values LV to the portable device 300. In this step, the identification ID and the aligned values LV are sent from the server 200 to the portable device 300 via the Wi-Fi communication or the LTE communication.

Afterwards, at step S117, the portable device 300 sends the aligned values LV to the monitoring device 420. In this step, the aligned values LV are sent from the portable device 300 to the monitoring device 420 via the Bluetooth communication.

Figure 5:
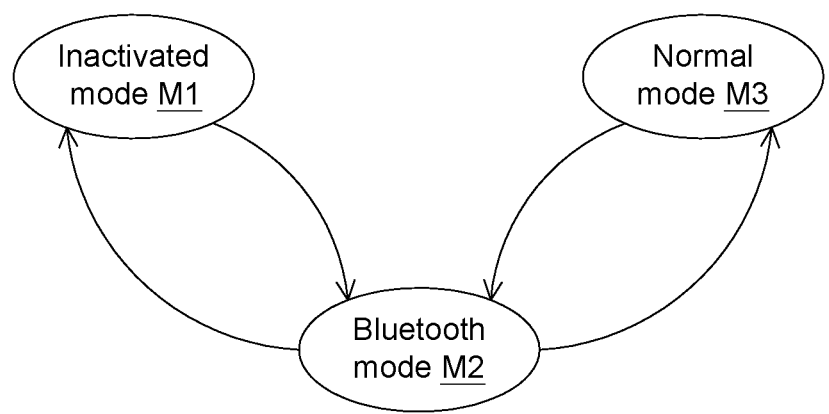
FIG. 5 shows the operation of the monitoring device.

Then, at step S118, the portable device 300 configures the monitoring device 420 as a normal mode M3 (shown in FIG. 5). Referring please to FIG. 5, which shows the operation of the monitoring device 420. The monitoring device 420 has an inactivated mode M1, a Bluetooth mode M2 and the normal mode M3. During the inactivated mode, the monitoring device 420 is shipped out for saving power. During the Bluetooth mode M2, the monitoring device 420 can be configured, upgraded or diagnosed by the portable device 300. During the normal mode M3, the monitoring device 420 is working for monitoring and sending the azimuth information, the tilt information and the roll information from the alignment-monitoring system to the server 300. The inactivated mode M1 is switched to the Bluetooth mode M2 by pressing the STATUS button of the monitoring device 420. The Bluetooth mode M2 is switched to the normal mode M3 by the portable device 300. The normal mode M3 is switched to the Bluetooth mode M2 by pressing the STATUS button of the monitoring device 420. The normal mode M3 is switched to the inactivated mode M1 by the portable device 200.

Next, at step S119, the measuring circuit 421 of the monitoring device 420 measures the antenna 100 to obtain offsets OS of the azimuth information, the tilt information and the roll information of the antenna 100. The offsets OS are respectively calculated from baselines which are the aligned values LV measured when the antenna 100 is completely aligned.

Then, at step S120, the communication circuit 422 of the monitoring device 420 sends the offsets OS of the azimuth information, the tilt information and the roll information to the server 200. In this step, the offsets OS are sent from the monitoring device 420 to the server 200 via the LTE communication. The step S119 and the step S120 are performed periodically according to the time information TI provided from the timer 423.

Base on above, the antenna 100 can be monitored to maintain the best transmission performance.

Figure 6:
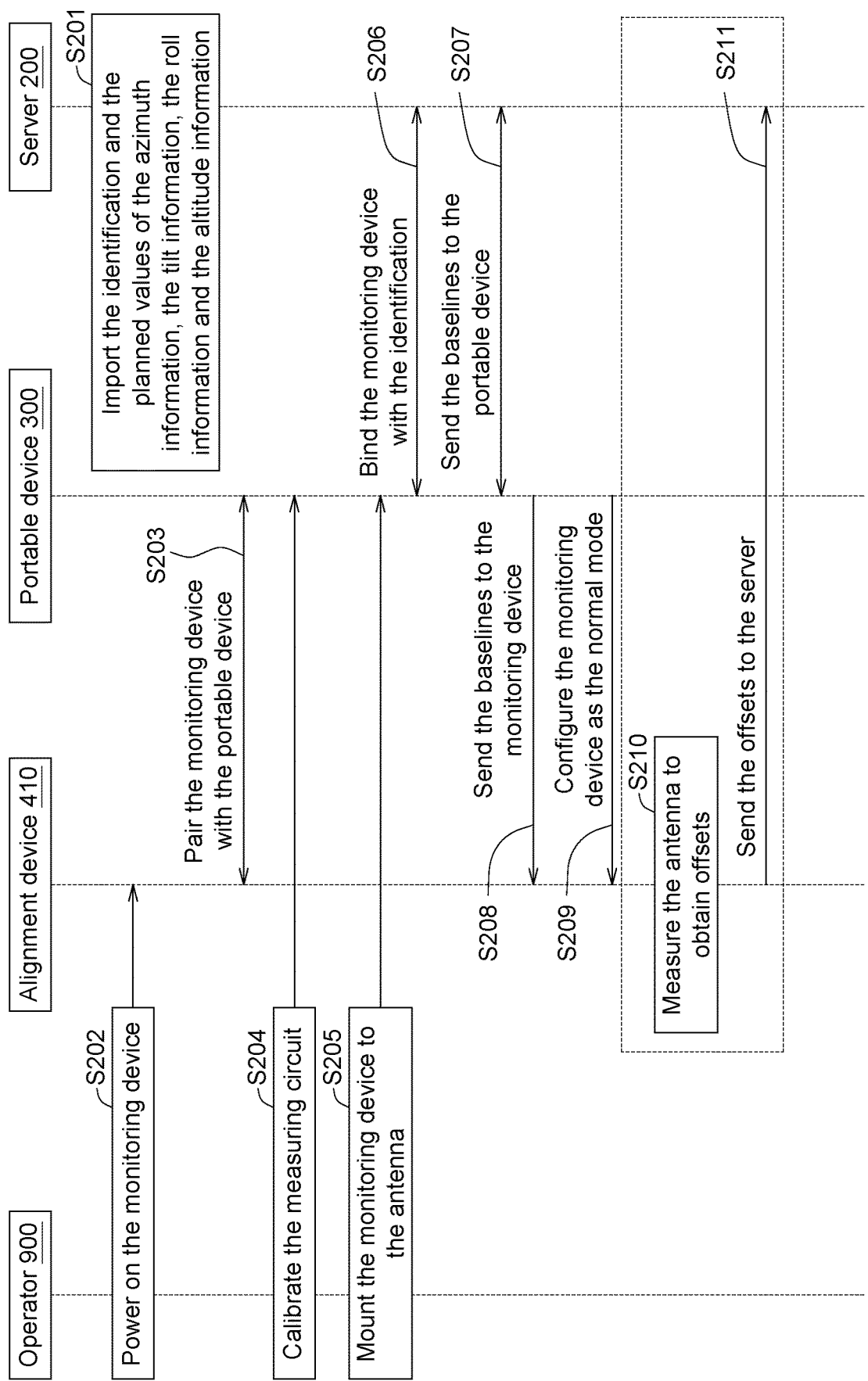
FIG. 6 shows a flowchart of the monitoring procedure of the antenna alignment-monitoring method according to another embodiment.

In another embodiment, the antenna alignment-monitoring system 400 may be used for the antenna 100 which is already set up. The antenna 100 only needs to perform the monitoring procedure. Refer please to FIG. 6, which shows a flowchart of the monitoring procedure of the antenna alignment-monitoring method according to another embodiment. At step S201, the identification ID and the planned values PV of the azimuth information, the tilt information, the roll information and the altitude information of the antenna 100 are imported to the server 200.

At step S202, the operator 900 powers on the monitoring device 420 of the antenna alignment-monitoring system 400. The operator 900 may push the STATUS button to activate the monitoring device 420.

Then, at step S203, the monitoring device 420 is paired with the portable device 300. In this step, the monitoring device 420 and the portable device 300 are paired via the Bluetooth communication.

Afterwards, at step S204, the operator 900 calibrates the measuring circuit 421. For example, the operator 900 may swing the monitoring device 420 in the 8 shaped trace to calibrate the measuring circuit 421.

Next, at step S205, the operator 900 mounts the monitoring device 420 to the antenna 100. In this step, the monitoring device 420 is fixedly adhered to the antenna 100.

Then, at step S206, the portable device 300 binds the monitoring device 420 with the identification ID.

Afterwards, at step S207, the communication circuit 220 of the server 200 sends the baselines BL to the portable device 300. In this step, the baselines BL are sent from the server 200 to the portable device 300 via the Wi-Fi communication or the LTE communication. If the server 200 does not record the aligned values LV of the antenna 100, the step S207 can be omitted and the portable device 300 can set each of the baselines BL as "0."

Next, at step S208, the portable device 300 sends the baselines BL to the monitoring device 420. In this step, the baselines BL are sent from the portable device 300 to the monitoring device 420 via the Bluetooth communication.

Next, at step S209, the portable device 300 configures the monitoring device 420 as the normal mode M3 (shown in FIG. 5).

Then, at step S210, the measuring circuit 421 of the monitoring device 420 measures the antenna 100 to obtain offsets OS of the azimuth information, the tilt information and the roll information of the antenna 100. The offsets OS are respectively calculated from the baselines BL which are the aligned values LV measured when the antenna 100 is completely aligned or "0."

Afterwards, at step S211, the communication circuit 422 of the monitoring device 420 sends the offsets OS of the azimuth information, the tilt information and the roll information to the server 200. In this step, the offsets OS are sent from the monitoring device 420 to the server 200 via the LTE communication. The step S210 and the step S211 are performed periodically according to the time information TI provided from the timer 423.

According to the embodiments above, the angle and the orientation of the antenna are measured and sent to the portable device or the server for aligning and monitoring the antenna, such that the angle and the orientation can be adjusted accurately to obtain the best transmission performance when setting up an antenna and the angle and the orientation of the antenna can be constantly monitored to maintain the best transmission performance.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An antenna alignment-monitoring method, comprising:
   measuring, by an alignment-monitoring system, an antenna to obtain azimuth information, tilt information and roll information of the antenna;
   sending the azimuth information, the tilt information and the roll information from the alignment-monitoring system to a portable device and a server;
   wherein the azimuth information, the tilt information and the roll information are sent to the portable device and shown on a user interface for aligning the antenna;
   the azimuth information, the tilt information and the roll information are sent to the server for monitoring the antenna.

2. The antenna alignment-monitoring method according to claim 1, wherein
   the azimuth information, the tilt information and the roll information are sent to the portable device via a first communication;
   the azimuth information, the tilt information and the roll information are sent to the server via a second communication,
   wherein the first communication is different from the second communication.

3. The antenna alignment-monitoring method according to claim 1, wherein the azimuth information, the tilt information and the roll information are periodically sent to the server for monitoring the antenna.

4. The antenna alignment-monitoring method according to claim 1, wherein each of the azimuth information, the tilt information and the roll information is an actual measured value.

5. The antenna alignment-monitoring method according to claim 1, wherein each of the azimuth information, the tilt information and the roll information is an offset from a baseline.

6. The antenna alignment-monitoring method according to claim 5, wherein each of the baselines is an aligned value measured when the antenna is completely aligned.

7. The antenna alignment-monitoring method according to claim 1, further comprising:
   sending a real-time surrounding image of the antenna from the alignment-monitoring system to the portable device, wherein the real-time surrounding image is shown on the user interface of the portable device.

8. The antenna alignment-monitoring method according to claim 1, further comprising:
   measuring, by the alignment-monitoring system, the antenna to obtain altitude information of the antenna;
   sending the altitude information to the portable device, wherein the altitude information is shown on the user interface for aligning the antenna.

9. An antenna alignment-monitoring method, comprising:
   measuring, by an alignment device, an antenna to obtain azimuth information, tilt information and roll information of the antenna;
   sending the azimuth information, the tilt information and the roll information from the alignment device to a portable device, wherein the azimuth information, the tilt information and the roll information are shown on a user interface of the portable device for aligning the antenna;
   measuring, by a monitoring device, the antenna to obtain the azimuth information, the tilt information and the roll information of the antenna; and
   sending the azimuth information, the tilt information and the roll information from the monitoring device to a server for monitoring the antenna.

10. The antenna alignment-monitoring method according to claim 9, wherein
    the azimuth information, the tilt information and the roll information are sent to the portable device via a first communication;
    the azimuth information, the tilt information and the roll information are sent to the server via a second communication,
    wherein the first communication is different from the second communication.

11. The antenna alignment-monitoring method according to claim 9, wherein the azimuth information, the tilt information and the roll information are periodically sent to the server for monitoring the antenna.

12. The antenna alignment-monitoring method according to claim 9, wherein each of the azimuth information, the tilt information and the roll information sent to the portable device is an actual measured value.

13. The antenna alignment-monitoring method according to claim 9, wherein each of the azimuth information, the tilt information and the roll information sent to the server is an offset from a baseline.

14. The antenna alignment-monitoring method according to claim 13, wherein each of the baselines is an aligned value measured when the antenna is completely aligned.

15. The antenna alignment-monitoring method according to claim 9, further comprising:
    sending a real-time surrounding image of the antenna from the alignment device to the portable device, wherein the real-time surrounding image is shown on the user interface of the portable device.

16. The antenna alignment-monitoring method according to claim 9, further comprising:
    measuring, by the alignment device, the antenna to obtain altitude information of the antenna;
    sending the altitude information from the alignment device to the portable device, wherein the altitude information is shown on the user interface for aligning the antenna.

17. An antenna alignment-monitoring system, comprising:
    a measuring circuit configured to measure an antenna to obtain azimuth information, tilt information and roll information of the antenna; and
    a communication circuit configured to send the azimuth information, the tilt information and the roll information to a portable device and a server;
    wherein the azimuth information, the tilt information and the roll information are sent to the portable device and shown on a user interface of the portable device for aligning the antenna;
    the azimuth information, the tilt information and the roll information are sent to the server for monitoring the antenna.

18. The antenna alignment-monitoring system according to claim 17, wherein the communication circuit is a Bluetooth communication circuit for sending the azimuth information, the tilt information and the roll information to the portable device, or a long Term Evolution (LTE) communication circuit for sending the azimuth information, the tilt information and the roll information to the server.

19. The antenna alignment-monitoring system according to claim 17, further comprising:
- a timer configured to provide a time information, wherein the communication circuit periodically sends the azimuth information, the tilt information and the roll information to the server for monitoring the antenna according to the time information.

20. The antenna alignment-monitoring system according to claim 17, further comprising:
- a camera configured to capture a real-time surrounding image of the antenna, wherein the communication circuit sends the real-time surrounding image to the portable device, and the real-time surrounding image is shown on the user interface of the portable device.

* * * * *